United States Patent
Kadoi et al.

(10) Patent No.: US 10,559,447 B2
(45) Date of Patent: Feb. 11, 2020

(54) CHARGED PARTICLE BEAM DEVICE WITH TRANSIENT SIGNAL CORRECTION DURING BEAM BLANKING

(71) Applicant: HITACHI HIGH-TECHNOLOGIES CORPORATION, Minato-ku, Tokyo (JP)

(72) Inventors: Ryo Kadoi, Tokyo (JP); Wen Li, Tokyo (JP); Kazuki Ikeda, Tokyo (JP); Hajime Kawano, Tokyo (JP); Hiroyuki Takahashi, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 6 days.

(21) Appl. No.: 15/562,810

(22) PCT Filed: Apr. 6, 2016

(86) PCT No.: PCT/JP2016/061250
§ 371 (c)(1),
(2) Date: Sep. 28, 2017

(87) PCT Pub. No.: WO2016/167166
PCT Pub. Date: Oct. 20, 2016

(65) Prior Publication Data
US 2018/0106610 A1    Apr. 19, 2018

(30) Foreign Application Priority Data

Apr. 13, 2015   (JP) .................................. 2015-081963

(51) Int. Cl.
*H01J 37/20* (2006.01)
*H01J 37/04* (2006.01)
(Continued)

(52) U.S. Cl.
CPC ............ *H01J 37/045* (2013.01); *G01B 15/00* (2013.01); *H01J 37/147* (2013.01); *H01J 37/20* (2013.01);
(Continued)

(58) Field of Classification Search
None
See application file for complete search history.

(56) References Cited

U.S. PATENT DOCUMENTS

2003/0126566 A1   7/2003 Saito
2009/0050802 A1*  2/2009 Noji ..................... G01R 31/307
                                                           250/307
(Continued)

FOREIGN PATENT DOCUMENTS

JP   2003-148915 A   5/2003
JP   2012-023316 A   2/2012
(Continued)

*Primary Examiner* — James Choi
(74) *Attorney, Agent, or Firm* — Miles & Stockbridge, P.C.

(57) ABSTRACT

A charged particle apparatus including a charged particle source unit; a blanking electrode unit that blanks a charged particle beam launched from the charged particle source unit; a deflecting electrode unit that deflects the charged particle beam; an objective lens unit that converges the charged particle beam deflected by the deflecting electrode unit and radiates the charged particle beam to a surface of a sample; a secondary charged particle detection unit that detects a secondary charged particle generated from the sample; a signal processing unit that processes a signal obtained by detecting the secondary charged particle; and a control unit that corrects a transient signal when the blanking of the charged particle beam is turned off by the blanking electrode, such that an image with no distortion can be
(Continued)

obtained even when the blanking electrode is operated to turn on and off at a high speed.

3 Claims, 5 Drawing Sheets

(51) Int. Cl.
  *H01J 37/147* (2006.01)
  *H01J 37/28* (2006.01)
  *G01B 15/00* (2006.01)
(52) U.S. Cl.
  CPC ......... *H01J 37/28* (2013.01); *H01J 2229/568* (2013.01)

(56) References Cited

U.S. PATENT DOCUMENTS

| | | |
|---|---|---|
| 2012/0015303 A1 | 1/2012 | Hirata et al. |
| 2014/0008534 A1* | 1/2014 | Li .................... H01J 37/265 250/307 |
| 2015/0041643 A1 | 2/2015 | Li et al. |

FOREIGN PATENT DOCUMENTS

| | | |
|---|---|---|
| JP | 2014-016186 A | 1/2014 |
| JP | 2015-035379 A | 2/2015 |

* cited by examiner

[Fig. 1]
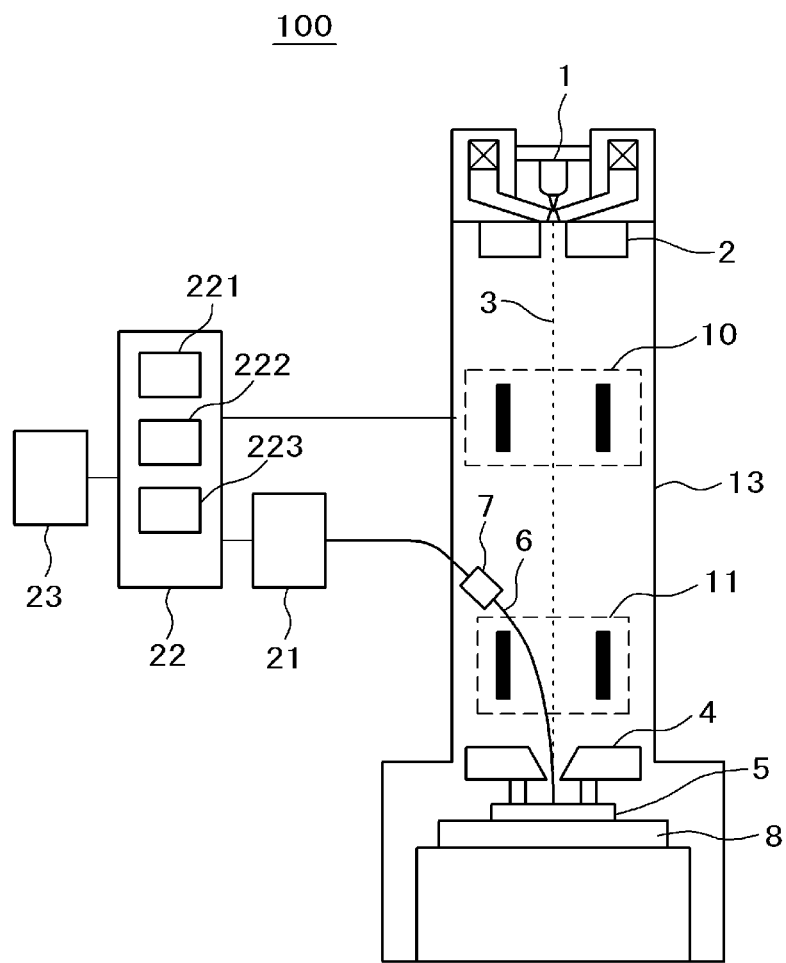

[Fig. 2]
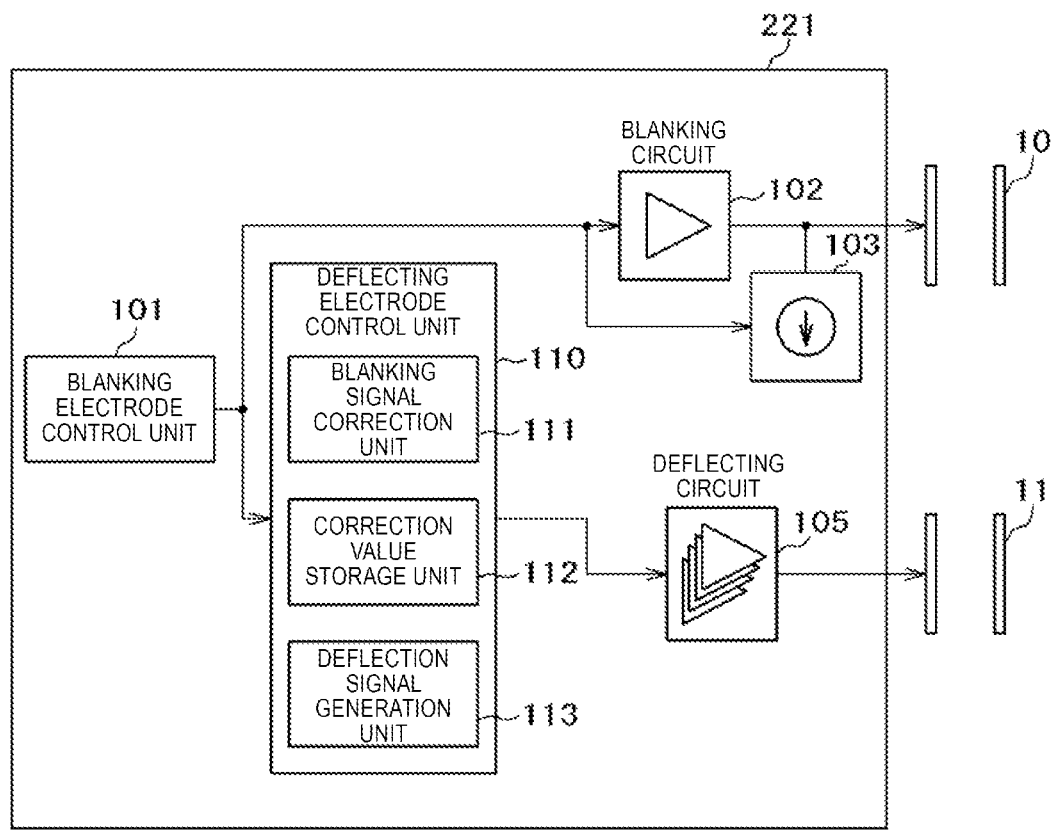

[Fig. 3A]
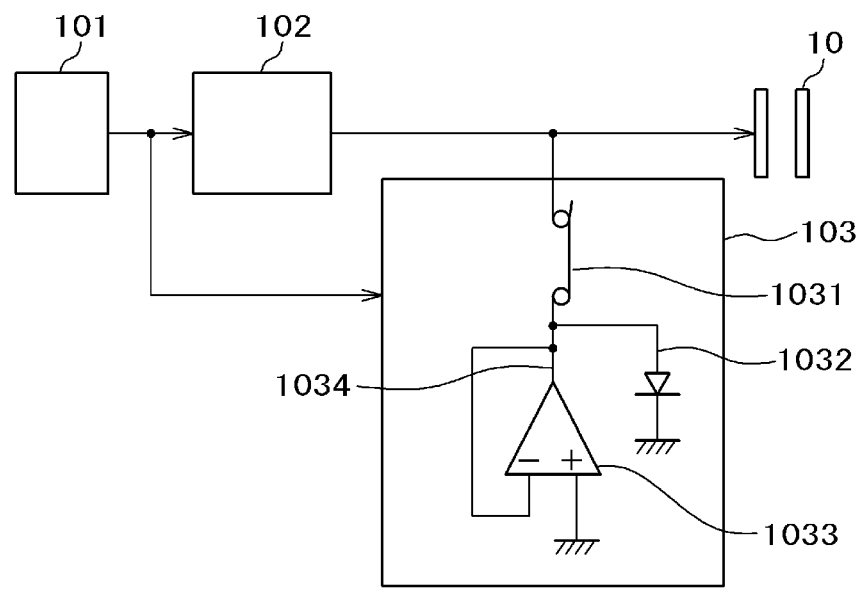
[Fig. 3B]
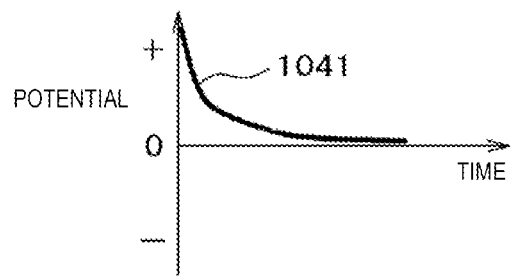
[Fig. 3C]
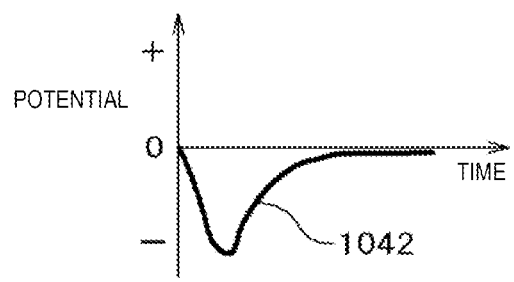

[Fig. 3D]
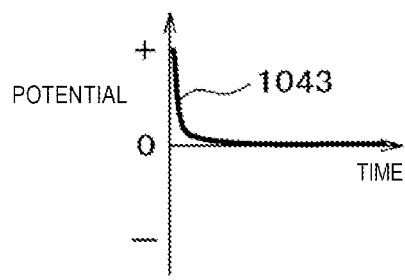
[Fig. 4]
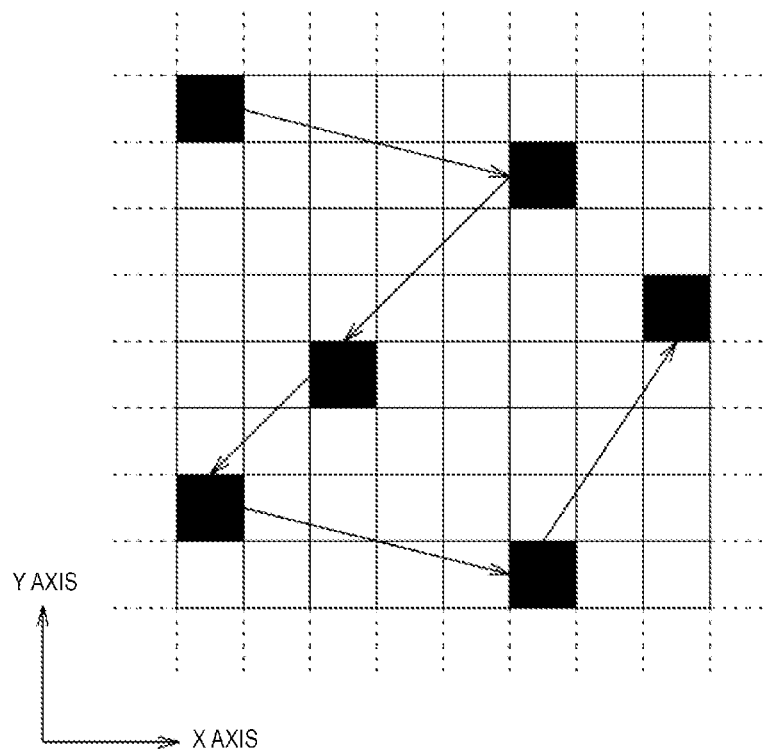

[Fig. 5]
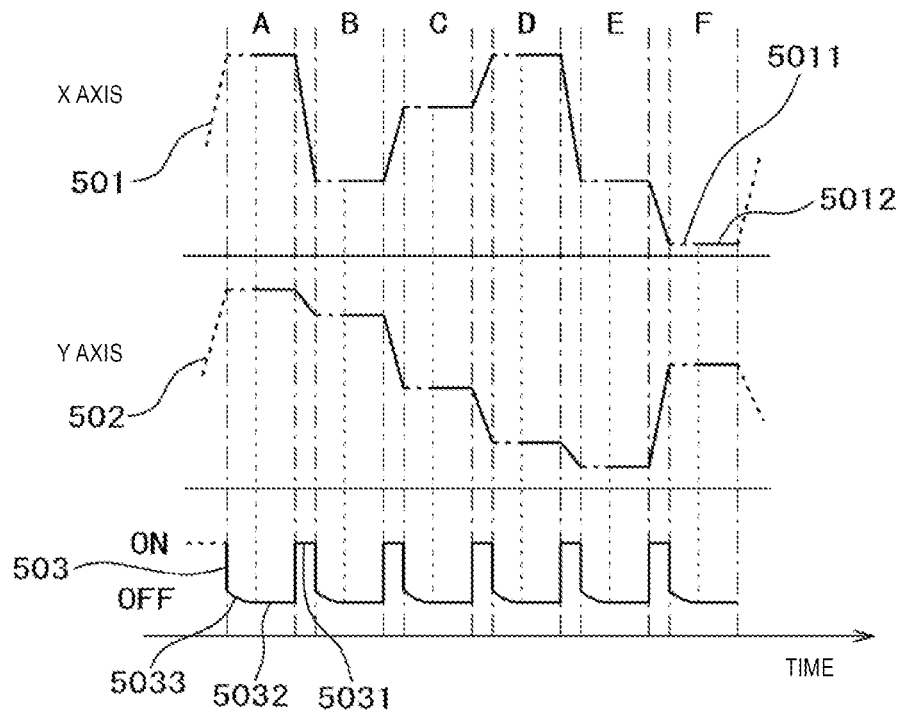
[Fig. 6]
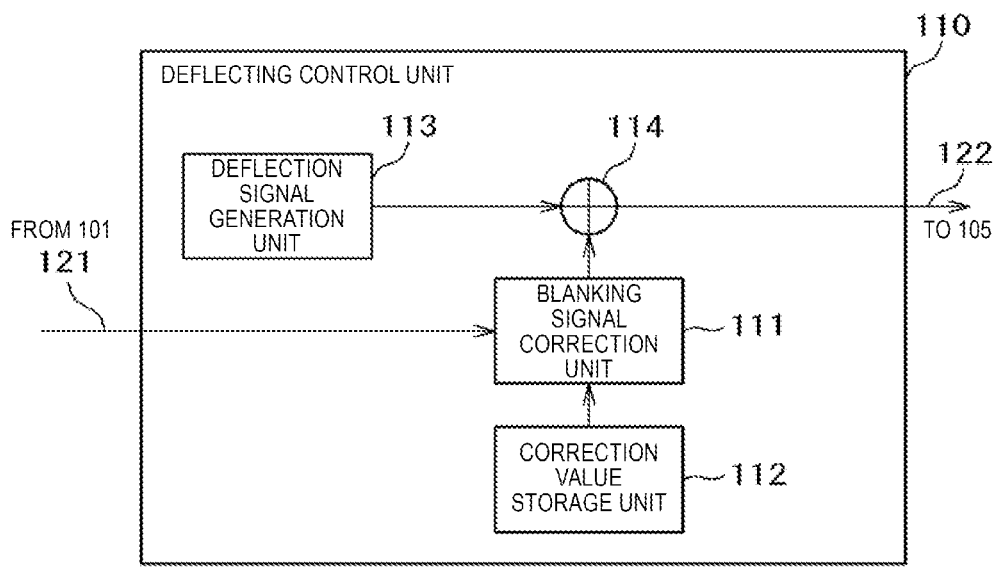

CHARGED PARTICLE BEAM DEVICE WITH TRANSIENT SIGNAL CORRECTION DURING BEAM BLANKING

TECHNICAL FIELD

The present invention relates to a charged particle beam apparatus, and more particularly, to a charged particle beam apparatus measuring or inspecting a minute pattern formed on a semiconductor substrate.

BACKGROUND ART

A charged particle beam apparatus that measures or inspects a minute pattern formed on a semiconductor substrate is described in JP-A-2003-148915 (PTL 1). PTL 1 describes that "position comparison between CAD data and a formed pattern is performed, drawing correction is performed from a comparison result, and precision is inspected in a pattern drawing apparatus".

CITATION LIST

Patent Literature

PTL 1: JP-A-2003-148915

SUMMARY OF INVENTION

Technical Problem

In a case in which a minute pattern formed on a semiconductor substrate is measured or inspected using a charged particle beam apparatus, there is a problem of charging of the surface of a sample occurring when a charged particle beam is radiated to a measurement or inspection target sample. When the charging occurs on the surface of the sample, a problem occurs that the charged particle beam may not be radiated to a desired spot on the surface of the sample or an image with good contrast may not be obtained. Thus, reliability of the measurement or the inspection may deteriorate. The minuteness of the pattern formed on the semiconductor substrate is progressed and this problem is further manifest when an image of a minuter region is acquired.

To resolve the charging problem of the sample in the charged particle beam apparatus, it is necessary to suppress an increase in potential of the surface of the sample by radiation of the charged particle beam. As one method, there is a method of shortening a radiation time of the charged particle beam to the sample. As one method of shortening the radiation time of the charged particle beam to the sample, there is a method of delicately dividing radiation positions of the charged particle beam on the sample by repeatedly turning on and off the radiation of the charged particle beam to the sample at a high speed during the scanning of the charged particle beam. This is a method of discretely radiating the charged particle beam to a sample in one scanning instead of a method of continuously radiating the charged particle beam during one scanning in the related art. By adopting such a radiation method, it is possible to shorten a radiation time from the viewpoint of the entire sample and suppress an increase in potential of the surface of the sample to realize multipoint measurement.

To perform the multipoint measurement, it is necessary to perform high-speed blanking control such that radiation of the charged particle beam to the sample is turned on and off at a high speed with a blanking electrode. In a case in which the control is performed by turning on and off the blanking electrode, a transient signal occurs immediately after the blanking electrode is switched from the ON state to the OFF state. Therefore, positional deviation occurs in the charged particle beam radiated to the surface of the sample. When the blanking electrode is operated at a high speed, there is a problem that distortion occurs in an image immediately after the blanking electrode is switched from the ON state to the OFF state.

PTL 1 describes that positional deviation in a charged particle beam scanning position is inspected as a method of performing position comparison between CAD data and a formed pattern, performing drawing correction from a comparison result, and inspecting precision in the pattern drawing apparatus. However, a problem is not considered that distortion occurs in an image obtained at the time of turning off the blanking electrode and starting radiating the charged particle beam to a sample since a transient signal occurs at the time of switching between ON and OFF when the blanking electrode is operated to turn on and off at a high speed.

The invention is finalized to resolve the foregoing problem of the technology of the related art and provides a charged particle beam apparatus capable of obtaining an image with no distortion even when a blanking electrode is operated to turn on and off at a high speed. The invention also provides a charged particle beam apparatus capable of performing measurement or inspection of a minute pattern with high precision.

Solution to Problem

To resolve the foregoing problem, according to an aspect of the invention, there is provided a charged particle apparatus including a charged particle source unit that launches a charged particle beam; a blanking electrode unit that blanks the charged particle beam launched from the charged particle source unit; a deflecting electrode unit that deflects the charged particle beam launched from the charged particle source unit and passing through the blanking electrode unit; an objective lens unit that converges the charged particle beam deflected by the deflecting electrode unit and radiates the charged particle beam to a surface of a sample; a secondary charged particle detection unit that detects a secondary charged particle generated from the sample irradiated with the charged particle beam; a signal processing unit that processes a signal obtained by detecting the secondary charged particle by the secondary charged particle detection unit; and a control unit that controls the charged particle source unit, the blanking electrode unit, the deflecting electrode unit, the objective lens unit, the secondary charged particle detection unit, and the signal processing unit. The control unit includes a transient signal correction unit that corrects a transient signal at the time of turning off the blanking of the charged particle beam by the blanking electrode.

To resolve the foregoing problem, according to an aspect of the invention, there is provided a charged particle apparatus including a charged particle source unit that launches a charged particle beam; a blanking electrode unit that blanks the charged particle beam launched from the charged particle source unit; a deflecting electrode unit that deflects the charged particle beam launched from the charged particle source unit and passing through the blanking electrode unit; an objective lens unit that converges the charged particle beam deflected by the deflecting electrode unit and radiates the charged particle beam to a surface of a sample; a secondary charged particle detection unit that detects a secondary charged particle generated from the sample irradiated with the charged particle beam; a signal processing unit that processes a signal obtained by detecting the secondary charged particle by the secondary charged particle detection unit; and a control unit that controls the charged particle source unit, the blanking electrode unit, the deflecting electrode unit, the objective lens unit, the secondary charged particle detection unit, and the signal processing unit. The control unit includes a blanking electrode control unit that controls the blanking electrode, a blanking circuit that receives a signal for controlling ON and OFF of a voltage to be applied to the blanking electrode output from the blanking electrode control unit and operates the blanking electrode, and a discharge circuit unit that receives a control signal output from the blanking electrode control unit and discharges a charge remaining in the blanking electrode when a voltage to be applied to the blanking electrode is switched from ON to OFF by the blanking circuit.

To resolve the foregoing problem, according to an aspect of the invention, there is provided a charged particle apparatus including a charged particle source unit that launches a charged particle beam; a blanking electrode unit that blanks the charged particle beam launched from the charged particle source unit; a deflecting electrode unit that deflects the charged particle beam launched from the charged particle source unit and passing through the blanking electrode unit; an objective lens unit that converges the charged particle beam deflected by the deflecting electrode unit and radiates the charged particle beam to a surface of a sample; a secondary charged particle detection unit that detects a secondary charged particle generated from the sample irradiated with the charged particle beam; a signal processing unit that processes a signal obtained by detecting the secondary charged particle by the secondary charged particle detection unit; and a control unit that controls the charged particle source unit, the blanking electrode unit, the deflecting electrode unit, the objective lens unit, the secondary charged particle detection unit, and the signal processing unit. The control unit further includes a deflecting electrode control unit that controls the deflecting electrode unit, and the deflecting electrode control unit receives a signal for switching between ON and OFF of the voltage to be applied to the blanking electrode from the blanking electrode control unit and controls a signal to be applied to the deflecting electrode unit.

Advantageous Effects of Invention

According to the invention, in the charged particle beam apparatus, an image with no distortion is obtained at a high speed even when the blanking electrode is operated to turn on and off at a high speed. As a result, in the charged particle beam apparatus, it is possible to perform measurement or inspection of a minute pattern with high precision.

BRIEF DESCRIPTION OF DRAWINGS

FIG. 1 is a block diagram illustrating a schematic configuration of a charged particle beam apparatus according to an embodiment of the invention.

FIG. 2 is a block diagram illustrating a schematic configuration of a blanking electrode and deflecting electrode control unit of the charged particle beam apparatus according to the embodiment of the invention.

FIG. 3A is a block diagram illustrating a configuration of an active charge circuit of the charged particle beam apparatus according to the embodiment of the invention.

FIG. 3B is a graph illustrating a change in potential of a particular blanking electrode when an active discharge circuit is not operated and the blanking electrode is turned off according to the embodiment of the invention.

FIG. 3C is a graph illustrating a change in potential of an output terminal of a high-speed amplifier of the active discharge circuit when the blanking electrode is turned off according to the embodiment of the invention.

FIG. 3D is a graph illustrating a change in potential of a particular blanking electrode when the active discharge circuit is operated and the blanking electrode is turned off according to the embodiment of the invention.

FIG. 4 is an expanded diagram illustrating the surface of a sample on which an example of a scanning trajectory of vector scanning is indicated.

FIG. 5 is a graph illustrating examples of a deflecting signal and a blanking signal when multipoint measurement is performed by the vector scanning.

FIG. 6 is a block diagram illustrating an internal configuration of a deflecting electrode control unit according to the embodiment of the invention.

DESCRIPTION OF EMBODIMENTS

The invention provides a charged particle beam apparatus that resolves the problem of charging of the surface of a sample occurring when a charged particle beam is radiated to a measurement or inspection target sample in a case in which the charged particle beam apparatus is used to measure or inspect a minute pattern formed on a semiconductor substrate, obtains an image with no distortion even when a blanking electrode is operated to turn on and off at a high speed, and is capable of performing measurement or inspection of the minute pattern with high precision.

When charging occurs on the surface of a sample, a charged particle beam may not be radiated to a desired spot on the surface of the sample. Thus, distortion occurs in an acquired image and reliability of measurement or inspection may deteriorate.

To resolve the charging problem of the sample in the charged particle beam apparatus, it is necessary to suppress an increase in potential of the surface of the sample by radiation of the charged particle beam. As one method, there is a method of shortening a radiation time of the charged particle beam to the sample. As one method of shortening the radiation time of the charged particle beam to the sample, there is a method of delicately dividing radiation positions of the charged particle beam on the sample by repeatedly turning on and off the radiation of the charged particle beam to the sample at a high speed during the scanning of the charged particle beam. This is a method of discretely radiating the charged particle beam to a sample in one scanning instead of a method of continuously radiating the charged particle beam to a sample during one scanning in the related art. By adopting such a radiation method, it is possible to shorten a radiation time from the viewpoint of the entire sample and suppress an increase in potential of the surface of the sample to realize multipoint measurement.

To perform the multipoint measurement, it is necessary to perform high-speed blanking control such that radiation of the charged particle beam to the surface of the sample is repeatedly turned on and off at a high speed during one scanning of the charged particle beam. In a blanking electrode on which the blanking control is performed, a transient signal occurs at the time of switching between ON and OFF. Therefore, when the blanking electrode is operated at a high speed, there is a problem that distortion occurs in an image immediately after the switching between ON and OFF.

To prevent a sample from being charged due to radiation of a charged particle beam to the sample being focused on a certain spot, it is necessary to perform vector scanning to scan a sample in a free direction. In a case in which a transient signal is attempted to be corrected at the time of performing the vector scanning, a way to show the transient signal in an image is different depending on a direction (the X direction or the Y direction on the surface of the sample) of the scanning of the charged particle beam since a beam bending direction of blanking is a constant direction, and thus there is a problem that the transient signal may not be simply corrected.

In the invention, occurrence of a transient signal of response delay or the like is suppressed at the time of switching a blanking signal from ON to OFF and a period in which an image with no distortion can be acquired is lengthened as long as possible so that a clearer image is obtained. As a result, it is possible to perform measurement or inspection of a minute pattern with high precision.

Hereinafter, an embodiment of the invention will be described with reference to the drawings.

EMBODIMENT

In the embodiment, a charged particle beam apparatus accelerating a convergence speed of blanking and a method of accelerating the convergence speed will be described.

[Configuration]

First, a configuration of the charged particle beam apparatus 100 is illustrated in FIG. 1. The charged particle beam apparatus 100 includes a charged particle gun 1 that outputs a charged particle beam 3, a focusing lens 2 that focuses the charged particle beam 3, a deflecting electrode 11 that changes a direction of the charged particle beam 3 and controls a position at which scanning of the charged particle beam 3 on a sample 5 is performed, a blanking electrode 10 that turns on and off radiation of the charged particle beam 3 to the sample 5, an objective lens 4 that focuses the charged particle beam 3 again, the sample 5 which is a measurement target, a stage 8 on which the sample 5 is mounted and which is movable within a plane, a secondary charged particle 6 released from the sample 5 when the charged particle beam 3 is radiated and scanned, and a detector 7 that detects the released secondary charged particle. The charged particle gun 1, the focusing lens 2, the deflecting electrode 11, the blanking electrode 10, the objective lens 4, the sample 5, the detector 7, and the stage 8 are accommodated inside a chamber 13 capable of evacuating the inside.

The charged particle beam apparatus 100 includes a signal processing unit 21 that processes a signal detected with the detector 7, obtains a charged particle image of the sample 5, and measures or inspects the sample 5, a control unit 22 that controls the charged particle gun 1, the focusing lens 2, the deflecting electrode 11, the blanking electrode 10, the objective lens 4, the detector 7, and the stage 8 inside the chamber 13 and receives results processed by the signal processing unit 21, and an input and output unit 23 that inputs measurement or inspection conditions and outputs results.

The control unit 22 includes a blanking electrode and deflecting electrode control unit 221 controlling the blanking electrode 10 and the deflecting electrode 11, a correction value generation unit 222, and a storage unit 223.

In this configuration, the control unit 22 performs control such that a charged particle is generated from the charged particle gun 1 and is converged by the focusing lens 2 to form a charged particle beam 3. The charged particle beam 3 reaches the blanking electrode 10 and goes straight without being affected by the blanking electrode 10 to reach the deflecting electrode 11 when the blanking electrode 10 is in the OFF state. Conversely, when the blanking electrode 10 is in the ON state, the charged particle beam 3 does not reach a measurement region of the sample 5 since a trajectory of the charged particle beam 3 is bent by the blanking electrode 10.

The trajectory of the charged particle beam 3 reaching the deflecting electrode 11 is scanned through an operation of an electric field formed by the deflecting electrode 11, and thus the charged particle beam 3 is converged by the objective lens 4 to be thinly narrowed and is radiated to the surface of the sample 5 and scanned.

A secondary charged particle 6 according to the position of the surface is generated from the surface of the sample 5 on which the thinly narrowed charged particle beam 3 is radiated and scanned and a part of the secondary charged particle 6 is detected by the detector 7. A detection signal of the secondary charged particle detected by the detector 7 is transmitted to the signal processing unit 21 to be processed. Thus, a secondary charged particle image of the surface of the sample 5 is formed so that a minute pattern formed on the sample can be measured and inspected.

In a case in which the charged particle beam apparatus 100 is a measurement apparatus that measures dimensions of a pattern form on the surface of the sample, the signal processing unit 21 measures the dimensions of the pattern formed on the surface of the sample 5, an interval of an adjacent pattern, dimensions of main portions of the pattern, and the like from the formed secondary charged particle image, and results of the measurement are displayed by the input and output unit 23.

FIG. 2 illustrates a configuration of the blanking electrode and deflecting electrode control unit 221 controlling the blanking electrode 10 and the deflecting electrode 11 inside the control unit 22. The blanking electrode and deflecting electrode control unit 221 includes a blanking electrode control unit 101 which controls ON and OFF of the blanking electrode 10, a blanking circuit 102 to which a signal from the blanking control unit 101 is input and which applies a voltage according to the ON or OFF of the input signal to the blanking electrode 10, an active discharge circuit 103 which extracts charges of the blanking electrode 10 in tandem with a signal of the blanking electrode control unit 101, a deflecting electrode control unit 110, and a deflecting circuit 105. The deflecting electrode control unit 110 includes a blanking signal correction unit 111 which corrects a blanking signal, a correction value storage unit 112 that stores a correction value for the blanking signal, and a deflecting signal generation unit 113 that generates a deflecting signal. A signal output from the deflecting electrode control unit 110 is amplified by the deflecting circuit 105 to be applied to the deflecting electrode 11.

FIG. 6 illustrates an internal configuration of the deflecting electrode control unit 110. The deflecting signal generation unit 113 generates an uncorrected original deflecting signal. The blanking signal correction unit 111 outputs a blanking correction signal based on the correction value stored in the correction value storage unit 112 at a timing at which a blanking signal 121 output from the blanking electrode control unit 101 is switched. The correction value storage unit 112 stores the correction value or a correction equation. The uncorrected original deflecting signal output from the deflecting signal generation unit 113 and the blanking correction signal output from the blanking signal correction unit 111 are added by a signal addition unit 114. Then, an output signal 122 is output from the deflecting electrode control unit to be input to the deflecting circuit 105.

FIG. 4 illustrates an example of beam scanning of the charged particle beam apparatus 100. The charged particle beam 3 is scanned in the order of measurement target regions A, B, C, . . . in various directions. FIG. 5 illustrates examples of the deflecting signal applied to the deflecting electrode 10 and the blanking control signal applied to the blanking electrode 11 used for scanning the charged particle beam 3.

When a blanking voltage is applied by the blanking circuit 102 and the blanking electrode 10 enters the ON state, the trajectory of the charged particle beam 3 passing through the blanking electrode 10 is bent, and thus does not reach a measurement region of the sample 5. Conversely, when the application of the blanking voltage by the blanking circuit 102 is stopped, the blanking electrode 10 enters the OFF state. In this state, the trajectory of the charged particle beam 3 is not bent and the charged particle beam 3 passing through the blanking electrode 10 directly reaches the deflecting electrode 11. Then, the deflection of the deflecting circuit 105 is controlled and radiated to the sample 5. In this configuration, when the blanking circuit 102 performs control such that the blanking electrode 10 is switched from ON to OFF, a transient signal of response delay or the like may occur in a blanking control signal generated by the blanking circuit 102.

The active discharge circuit 103 in the configuration illustrated in FIG. 2 has an operational effect of suppressing the occurrence of the transient signal of response delay or the like in the blanking control signal output from the blanking circuit 102. Hereinafter, an operation will be described.

[Operation]

A transient signal of response delay or the like in the blanking control signal occurs in both of the time of switching the blanking electrode 10 from ON to OFF and the time of switching the blanking electrode 10 from OFF to ON. There is a problem when an image is acquired in a case in which the sample 5 is measured or inspected in the charged particle beam apparatus 100. Therefore, the time of switching the blanking electrode 10 from ON to OFF will be described.

First, the blanking electrode control unit 101 outputs a signal to operate blanking from ON to OFF. The blanking circuit 102 inputs the signal from the blanking electrode control unit 101 and operates to set a voltage to be applied to the blanking electrode 10 to 0 V. At this time, the signal from the blanking electrode control unit 101 is also simultaneously input to the active discharge circuit 103.

FIG. 3A illustrates a configuration of the active discharge circuit 103. The active discharge circuit 103 is configured to include a switch 1031, a diode 1032, and a high-speed amplifier 1033. The switch 1031 receives a signal for turning off the blanking from the blanking electrode control unit 101 to close a contact point and receives a signal for turning on the blanking to open the contact point. The diode 1032 is connected to a circuit side of the switch 1031. One terminal of the high-speed amplifier 1033 connected to the circuit side of the switch 1031 is grounded. In the other terminal of the high-speed amplifier 1033, an output from the high-speed amplifier 1033 is negatively fed back.

In a case in which the blanking is turned off without using the active discharge circuit 103, charges are collected in the blanking electrode 10 at the moment of OFF. Therefore, the potential of the blanking electrode 10 gradually decreases, as indicated by a waveform 1041 in FIG. 3B. Thus, a time is relatively necessary until the potential reaches zero.

On the other hand, in the configuration in which the active discharge circuit 103 illustrated in FIG. 3A is used, when the switch 1031 receives a signal for turning off the blanking from the blanking electrode control unit 101 to close the contact point, the potential of the output terminal 1034 of the high-speed amplifier 1033 of the active discharge circuit 103 is changed to a waveform illustrated in FIG. 3C according to the potential of the blanking electrode 10. As a result, the potential of the blanking electrode 10 rapidly becomes close to zero (is discharged), as illustrated in FIG. 3D. Thus, compared to a case in which the active discharge circuit 103 illustrated in FIG. 3B is not used, it is possible to considerably shorten a time until the potential reaches zero.

As described above, by inputting the signal from the blanking electrode control unit 101 and operating the active discharge circuit 103, it is possible to extract charges from the blanking electrode 10 by the active discharge circuit 103 so that the voltage of the blanking electrode 10 becomes 0 V as quickly as possible and set the voltage of the blanking electrode 10 to 0 V as quickly as possible.

However, even when the active discharge circuit 103 is used, the potential of the blanking electrode 10 may not be set to zero or nearly zero instantly due to transient characteristics of the blanking electrode 10. Accordingly, the deflecting electrode control unit 110 receives a signal for turning off the blanking from the blanking electrode control unit 101 and controls the deflecting electrode 11 such that distortion of an image detected immediately after the blanking is turned off is corrected.

That is, the signal for turning off the blanking from the blanking electrode control unit 101 is received, the blanking signal correction unit 111 inside the deflecting electrode control unit 110 generates a correction signal of a control signal of the deflecting electrode 11 transmitted to the deflecting circuit 105 in accordance with a correction equation or a correction table stored in the correction value storage unit 112, and the correction signal is added to a signal generated by the deflecting signal generation unit 113 in the addition unit 114 to be output to the deflecting circuit 105. The deflecting circuit 105 amplifies the deflecting signal including the correction signal output from the deflecting electrode control unit 110 and applies the amplified deflecting signal to the deflecting electrode 11.

Thus, it is possible to correct the distortion of the image generated immediately after the blanking is switched from ON to OFF.

An example of the correction equation stored in the correction value storage unit 112 is expressed as follows.

$$V_{DEFcor} = V_{DEF} - am \cdot k \cdot \sin\theta \cdot \exp(-bt) \qquad \text{Expression 1}$$

Here, a is a magnification correction coefficient, m is a measurement magnification of SEM, b is a time correction system, t is an elapsed time after turning off the blanking, k is a coefficient in a measurement mode, and θ is a scanning direction with respect to a blanking electrode axis. In addition, coefficients other than t and b are coefficient determined in advance depending on measurement conditions and t is spontaneously determined since t is the elapsed time. A method of obtaining b will be described later.

FIG. 4 is a diagram illustrating scanning in which a beam is radiated to a plurality of points. A case in which a target irradiated with the charged particle beam 3, for example, the sample 5 which is a measurement target of SEM, is viewed from the upper side is illustrated. A, B, C, . . . indicate "points" irradiated with the charged particle beam 3 by turning off the blanking by the blanking electrode 10. Arrows between the "points" indicate portions in which deflecting positions are moved to subsequent radiation points without radiating the charged particle beam 3 to the sample 5 by turning on the blanking of the charged particle beam 3 by the blanking electrode 10. The scanning is referred to as multipoint flying scanning.

In the example illustrated in FIG. 4, the example in which the "points" A, B, C, . . . irradiated with the charged particle beam 3 are disposed at random by turning off the blanking is illustrated, but the "points" A, B, C, . . . may be disposed in a straight shape. In this case, an interval of the "points" A, B, C, . . . may be set to an equal interval.

FIG. 5 illustrates output deflecting signals 501 and 502 of the deflecting signal generation unit 113 on the X and Y axes and an output signal 503 of the blanking circuit 102 in a case in which the multipoint flying scanning is performed. A period 5032 in which the output signal 503 of the blanking circuit 102 is turned off is a period in which the charged particle beam 3 is radiated to the sample 5. A period 5031 in which the output signal 503 of the blanking circuit 102 is turned on is a period in which the trajectory of the charged particle beam 3 is changed by the blanking electrode 10 and the radiation of the charged particle beam 3 to the sample 5 is stopped. That is, the blanking signal 503 is turned on when the charged particle beam 3 is moved between measurement regions and is turned off when the charged particle beam 3 is in the measurement region, and the charged particle beam 3 is operated to be radiated in the measurement region.

When the blanking circuit 102 performs control such that the blanking of the blanking electrode 10 is switched, a transient signal 5033 of response delay or the like occurs in a signal generated from the blanking circuit 102. Therefore, when the signal generated from the blanking circuit 102 is switched from ON to OFF, an ineffective time may occur in initial switching until the signal is completely turned off (0 V). Distortion may occur in an image captured during the ineffective time and precision may deteriorate in the measurement or the inspection based on such an image.

That is, as illustrated in FIG. 5, the blanking signal 503 may include the transient signal 5033 of response delay or the like at the time of switching from ON: 5031 to OFF: 5032. Because of the transient signal, a time section (an ineffective section) 5011 in which a measurement image is not obtainable occurs. To sufficiently ensure a time (an effective section) 5012 in which a measurement image is obtained, time throughput performance of the charged particle beam apparatus may deteriorate. In a case in which the transient signal 5033 is attempted to be corrected, a way to show the transient signal in an image is different depending on a direction (the X direction or the Y direction on the surface of the sample) of the scanning of the charged particle beam since a bending direction of the charged particle beam 3 at the time of blanking by the electric field generated in the blanking electrode 10 is a constant direction irrespective of the scanning direction of the charged particle beam 3, and thus there is a problem that the transient signal may not be simply corrected.

Accordingly, in order not to acquire an image with large distortion for the ineffective time, the deflection electrode control unit 110 performs control such that the deflecting electrode 11 is controlled with the output signal 122 output by adding the uncorrected original deflecting signal output from the deflecting signal generation unit 113 and the blanking correction signal output from the blanking signal correction unit 111 by the signal addition unit 114.

On the other hand, after the blanking is turned off (0 V) (the transient signal 5033 is decreased to the degree that the transient signal can be neglected), an effective time in which the beam can be radiated to a desired position comes, the deflecting electrode 11 is controlled by the deflecting circuit 105 based on a signal generated by the deflecting signal generation unit 113 output from the deflecting electrode control unit 110 to radiate the converged charged particle beam 3 to the sample 5.

After a given effective time, the output signal 503 of the blanking circuit 102 is turned on again, the charged particle beam 3 is deflected by the blanking electrode 10, the radiation of the charged particle beam 3 to the surface of the sample 5 is stopped, the deflecting electrode 11 is controlled based on the signal from the deflecting signal generation unit 113 of the deflecting electrode control unit 110 in this state, and a radiation point position of the charged particle beam 3 on the sample 5 is deflected. By repeating the control of ON and OFF on the blanking electrode 10 and the control on the deflecting electrode 11, the beam is radiated in the order of the plurality of points (A, B, C, . . . ).

In this case, when the foregoing scheme is not adopted and imaging is stopped for the ineffective time, the entire radiation time may be longer. For example, in the case of SEM, it takes some time to perform the measurement. When the radiation time of the charged particle beam 3 is long, the sample may be charged, and thus a correct measurement result may not be obtained in the case of SEM.

However, as in the embodiment, the active discharge circuit extracts charges simultaneously with control of the blanking and the deflecting control unit outputs the deflecting signal corrected so that the transient signal of the blanking electrode is cancelled, it is possible to shorten the time of the transient signal until the blanking in FIG. 5 is completely turned off and correct distortion of the image acquired for the transient time. Therefore, the blanking can be turned on and off at a high speed, and thus it is possible to prevent a sample from being charged up and acquire an image with high quality at a high throughput.

Since the correction term includes the term of θ indicating the scanning direction with respect to the blanking electrode axis, the transient signal can be corrected without being affected by the scanning direction of the charged particle beam. Further, by accelerating the blanking, ON and OFF of radiation of an electronic beam can be performed at a high speed. Therefore, measurement of a multipoint flying operation can be performed at a high speed compared to the related art.

In a case in which the dimensions of a pattern formed on a sample are measured using the charged particle beam apparatus 100 according to the embodiment, not only is the pattern formed on the surface of the sample 5 in the X or Y direction but the pattern is formed in a slope direction depending on a case. According to the embodiment, however, since the correction term includes the term of θ indicating the scanning direction with respect to the blanking electrode axis, the transient signal can be corrected without being affected by the scanning direction of the charged particle beam. Therefore, the measurement or inspection of a pattern can be performed at a high throughput irrespective of the scanning direction of the charged particle beam 3.

Next, a derivation example of the correction equation for accelerating a convergence speed of the blanking will be described.

An output from the detector 7 is received, a signal processed by the signal processing unit 21 is received, and the correction equation is derived by the correction value generation unit 222 of the control unit 22.

First, the blanking electrode control unit 101 outputs a signal so that the blanking of the charged particle 3 by the blanking electrode 10 can be operated to be turned from on to off. The blanking circuit 102 operates so that a voltage applied to the blanking electrode 10 is 0 V. Simultaneously, the active discharge circuit 103 operates to extract charges so that the voltage of the blanking electrode 10 becomes 0 V as quickly as possible.

The deflecting electrode control unit 110 causes the blanking signal correction unit 111 not to perform a correction operation and directly outputs the signal generated by the deflecting signal generation unit 113 to the deflecting circuit 105. Then, the deflecting circuit 105 amplifies the signal and applies the amplified signal to the deflecting electrode 11. The detector 7 detects secondary electrons released from the sample 5 and outputs the intensity of the secondary electrons as an electric signal to the signal processing unit 21. Then, the signal processing unit 21 generates a measurement image from the detection signal.

The measurement image generated by the signal processing unit 21 is transmitted to the correction value generation unit 222 of the control unit 22, the generated image is compared to an ideal image to be originally measured and stored in the storage unit 223 in the correction value generation unit 222, and an unknown variable b is obtained using, for example, a least squares method so that distortion of the image approximates (Expression 1). Since the variables other than the variable b are known variables, (Expression 1) serves a correction equation. This (Expression 1) obtained by the correction value generation unit 222 is stored in the correction value storage unit 112.

As described above, by comparing the uncorrected measurement image to the ideal image and deriving the correction equation for correcting distortion, the correction equation used by the blanking signal correction unit 112 is obtained and the control of the deflecting circuit 101 is performed using the correction equation.

According to the embodiment, in a case in which the charged particle beam is scanned, by operating the blanking electrode at a high speed and repeating ON and OFF of the radiation of the charged particle beam to the surface of the sample, it is possible to shorten a standby time until start of acquisition of the image immediately after switching of the radiation from ON to OFF as much as possible. Thus, the throughput of the acquisition of the image is accelerated and an image in which a minute pattern is clearer and which has high quality can be obtained continuously and stably without generating a charge-up phenomenon when a minute pattern is imaged. As a result, in a case in which the dimensions of the minute pattern are measured, a throughput (the number of measurement points per unit time) of the measurement can be raised without degrading the precision of the measurement and without damaging the minute pattern.

In a case in which the dimensions of a pattern formed on the surface of the sample 5 are measured using the charged particle beam apparatus, it is important to overall raise a throughput of inspection or measurement by shortening a time in which one point is measured since the number of measurement points on the surface of the sample is large. According to the embodiment, since the dimensions of a pattern can be measured and an image with the pattern can be efficiently acquired irrespective of the direction of the pattern, the throughput of the inspection or measurement can be raised without deteriorating the precision.

The invention invented by the inventors has been described in detail according to the embodiments, but the invention is not limited to the foregoing embodiments and it is needless to say that the invention can be modified in various forms within the scope of the invention without departing from the gist of the invention.

REFERENCE SIGNS LIST 10 blanking electrode
11 deflecting electrode
101 blanking electrode control unit
102 blanking circuit
103 active discharge circuit
110 deflecting electrode control unit
111 blanking signal correction unit
112 correction value storage unit
113 polarized signal generation unit

The invention claimed is:

1. A charged particle beam apparatus comprising:
a charged particle source unit that launches a charged particle beam;
a blanking electrode unit that blanks the charged particle beam launched from the charged particle source unit;
a deflecting electrode unit that deflects the charged particle beam launched from the charged particle source unit and passing through the blanking electrode unit;
an objective lens unit that converges the charged particle beam deflected by the deflecting electrode unit and radiates the charged particle beam to a surface of a sample;
a secondary charged particle detection unit that detects a secondary charged particle generated from the sample irradiated with the charged particle beam;
a signal processing unit that processes a signal obtained by detecting the secondary charged particle by the secondary charged particle detection unit;
a control unit that controls the charged particle source unit, the blanking electrode unit, the deflecting electrode unit, the objective lens unit, the secondary charged particle detection unit, and the signal processing unit; and
a storage unit which stores a correction value,
wherein the control unit includes a transient signal correction unit that corrects a transient signal at the time of turning off the blanking of the charged particle beam by the blanking electrode by adding the uncorrected original deflecting signal and a blanking correction signal, based on the correction value at a timing at which the blanking signal output is switched, to the deflecting electrode,
wherein the stored correction value comprises a scanning direction on the sample, a predetermined magnification correction coefficient and a predetermined measurement magnification value,
wherein the transient signal correction unit is a discharge circuit that discharges a charge remaining in the blanking electrode when the blanking of the charged particle beam is turned off by the blanking electrode, and
wherein said discharge circuit comprises a switch electrically coupled between the blanking electrode and an output of an amplifier, said output is electrically connected in parallel with a diode electrically connected to ground, said switch being configured to receive a signal for turning off blanking from the blanking electrode unit to close a contact point and a signal for turning on blanking from the blanking electrode unit to open the contact point.

2. The charged particle beam apparatus according to claim 1,
wherein the transient signal correction unit is a deflecting electrode control unit that receives a signal for switching a voltage to be applied to the blanking electrode from ON to OFF and controls a signal to be applied to the deflecting electrode unit.

3. The charged particle beam apparatus according to claim 1,
wherein the signal processing unit processes a signal obtained by detecting the secondary charged particle by the secondary charged particle detection unit and measures dimensions of a pattern formed on the sample from a secondary charged particle image of the pattern.

* * * * *